United States Patent
Ko et al.

(10) Patent No.: US 10,520,140 B2
(45) Date of Patent: Dec. 31, 2019

(54) SUBSTRATE STRUCTURE FOR LED LIGHTING

(71) Applicant: MERLOT LABORATORIES INC., Seoul (KR)

(72) Inventors: Young-Hun Ko, Ulsan (KR); Ui-Chung Hong, Uijeongbu-si (KR); So-Bong Shin, Seoul (KR)

(73) Assignee: MERLOT LABORATORIES INC., Seoul (KR)

( * ) Notice: Subject to any disclaimer, the term of this patent is extended or adjusted under 35 U.S.C. 154(b) by 0 days.

(21) Appl. No.: 16/097,949

(22) PCT Filed: Jul. 20, 2016

(86) PCT No.: PCT/KR2016/007911
§ 371 (c)(1),
(2) Date: Oct. 31, 2018

(87) PCT Pub. No.: WO2018/016662
PCT Pub. Date: Jan. 25, 2018

(65) Prior Publication Data
US 2019/0145584 A1 May 16, 2019

(51) Int. Cl.
*F21K 9/238* (2016.01)
*H05K 1/14* (2006.01)
(Continued)

(52) U.S. Cl.
CPC .............. *F21K 9/238* (2016.08); *F21K 9/232* (2016.08); *F21V 19/00* (2013.01); *H05K 1/14* (2013.01);
(Continued)

(58) Field of Classification Search
CPC .......... F21K 9/238; F21K 9/232; F21K 19/00; H05K 1/14; H05K 3/366
See application file for complete search history.

(56) References Cited

U.S. PATENT DOCUMENTS

2009/0135595 A1   5/2009   Chen

FOREIGN PATENT DOCUMENTS

CN        201992394 U     9/2011
JP        2014154336 A    8/2014
(Continued)

OTHER PUBLICATIONS

English machine translation of CN201902394U (Year: 2011).*
(Continued)

*Primary Examiner* — Anne M Hines
(74) *Attorney, Agent, or Firm* — Lucas & Mercanti, LLP

(57) ABSTRACT

The present invention relates to a substrate structure for LED lighting, the structure being capable of improving the hemispherical intensity distribution of a lighting device in which an LED is used, thereby improving the light efficiency of the lighting device. The substrate structure includes a first substrate for mounting a first LED thereon and three second substrates, each for mounting a second LED thereon. The second substrates are coupled to the first substrate such that the second substrates are perpendicular to the first substrate and are arranged at an angular interval which is within a range of 115° to 125° with respect to each other in a cross-sectional view taken parallel to the first substrate. One or more second substrates of the three second substrates are provided with one or more control circuits for controlling operation of either of or both of the first LED and the second LED, in which the control circuit is disposed in an end portion of the second substrate in a direction perpendicular to the first substrate.

19 Claims, 11 Drawing Sheets

(51) Int. Cl.
  *H05K 3/36*    (2006.01)
  *F21K 9/232*   (2016.01)
  *F21V 19/00*   (2006.01)
  *F21Y 115/10*  (2016.01)
(52) U.S. Cl.
  CPC .......... *H05K 3/366* (2013.01); *F21Y 2115/10* (2016.08); *H05K 2201/048* (2013.01); *H05K 2201/10106* (2013.01)

(56) References Cited

FOREIGN PATENT DOCUMENTS

| KR | 10-2011-0007811 A | 1/2011 |
| KR | 10-2012-0033677 A | 4/2012 |
| KR | 10-2016-0116257 A | 10/2016 |
| WO | 2014089897 A1 | 6/2014 |

OTHER PUBLICATIONS

International Search Report for Corresponding International Application No. PCT/KR2016/007911 (2 Pages) (dated Apr. 21, 2017).

\* cited by examiner

SUBSTRATE STRUCTURE FOR LED LIGHTING

CROSS-REFERENCE TO RELATED APPLICATIONS

This application is a U.S. national stage of PCT/KR2016/007911, filed Jul. 20, 2016, the contents of which is incorporated herein by reference.

TECHNICAL FIELD

Embodiments of the present invention relate to a substrate structure for LED lighting. More particularly, embodiments of the present invention relate to a substrate structure for LED lighting, the structure being capable of improving the hemispherical intensity distribution of a lighting device which uses LEDs, thereby improving the light efficiency of the lighting device.

BACKGROUND ART

A light emitting diode (LED) is a semiconductor device that emits light when an electric current flows. More specifically, an LED refers to a PN junction diode made of an optical semiconductor such as gallium arsenide (GaAs) or gallium nitride (GaN). It is an electronic component that converts electrical energy to light energy.

In recent years, blue LEDs and ultraviolet LEDs based on nitrides that have good physical and chemical properties have emerged, and LEDs have found many applications because white light or other monochromatic light can be generated by using blue or ultraviolet LEDs and fluorescent materials.

LEDs have many advantages over other light sources, including longer lifetime, smaller size, lighter body, directional light emission, low voltage operation, strong resistance to impact and vibration, and being free of preheating time and complicated driving. For these reasons, LEDs can be used in various applications. For example, LEDs are increasingly used in more diverse applications such as compact lighting devices of mobile terminals, general indoor or outdoor lighting devices, automotive headlamps, and backlight lighting devices for large LCD displays.

Also, in recent years, LED lamps have been increasingly used in place of incandescent lamps and other bulb-type lighting devices.

In lighting, the term "hemispherical intensity distribution" refers to a characteristic in which light is not emitted only in a specific direction but is emitted in all directions. Generally, incandescent lamps have a good luminous intensity distribution, but the light intensity distribution of LED lighting is usually dependent on the structure of an LED driver and the structure of an LED substrate.

Regarding FIGS. 1 through 3, FIGS. 1 and 2 are perspective views illustrating an external form and a detailed structure of a typical LED bulb, and FIG. 3 is a diagram illustrating the luminous intensity distribution of a typical LED bulb.

As illustrated in the drawing, a conventional LED bulb has a structure in which a plurality of LEDs are disposed on one surface of an LED substrate in a widthwise direction perpendicular to a longitudinal direction of the LED substrate. Thus, the direction of light emission is limited, resulting in a poor luminous intensity distribution at the rear side.

In addition, a conventional LED bulb uses a heat sink to solve the problem of heat generation, the heat sink resulting in an increase in volume and weight and an increase in manufacturing cost of the LED bulb, and finally resulting in an increase in the product price.

DISCLOSURE

Technical Problem

Embodiments of the present invention provide an LED lighting substrate structure capable of improving the hemispherical intensity distribution of an LED lighting device and increasing the light efficiency of the LED lighting device.

In addition, embodiments of the present invention provide an LED lighting substrate structure being capable of improving a heat dissipation performance of an LED lighting device by using the convection phenomenon, resulting in elimination of a heat dissipating structure such as a heat sink from an LED lighting device. This will result in reduction in the overall volume and weight of an LED lighting device and a decrease in manufacturing cost. As a result, it is possible to provide an LED lighting device at a good price.

Technical Solution

An LED lighting substrate structure according to one embodiment of the present invention includes a first substrate for mounting a first LED thereon and second substrates arranged to be perpendicular to the first substrate.

The second substrates may be arranged at an angular interval which is within a range of from 115° to 125°.

A control circuit for controlling operation of either one of or both of the first LED and the second LED is disposed in a first region of one second substrate or a region of each of two or more second substrates of all the second substrates, the first region being disposed at one side of the first substrate in a direction perpendicular to the first substrate.

The first substrate may be provided with a control circuit for controlling operation of either one of or both of the first LED and the second LED.

In addition, for each of the second substrates, the second LEDs may be installed respectively on both surfaces of the second substrate. In addition, the first LED may be installed on a first surface of the first substrate, the first surface facing the second LED. Alternatively, the first LEDs may be installed respectively on both surfaces of the first substrate.

In addition, the second LEDs mounted on the second substrates may be positioned on a line having the same distance from the first substrate, and each region of the first substrate demarcated by the second substrates is provided with one or more first LEDs.

The first substrate may be provided with a vent hole for convection of heat between an inside region where the first LED and the second LED are disposed and an outside region where the first LED and the second LED are not disposed.

The vent hole is a single hole formed at the center of the first substrate.

The LED lighting substrate structure according to an embodiment of the present invention may further include a luminance sensor that is positioned on a surface of the first substrate or at a position spaced from the surface which is provided with the first LED. The luminance sensor senses the luminance around a lighting device including the first LED and the second LED.

The first substrate may be provided with three substrate engaging slits arranged at an angular interval of about 120° at an outer periphery of the first substrate so that the second substrates can be fitted to pass through the substrate engaging slits, and each of the second substrates may be provided with a substrate fitting slit into which the first substrate is inserted when the second substrates are coupled to the first substrate in a manner of being inserted into the substrate engaging slits of the first substrate, respectively.

When a first portion of each of the second substrates arranged to be perpendicular to the first substrate is defined as a front portion and the front portion is a portion relatively far from a driving circuit of a lighting device including the first LED and the second LED substrate than a midpoint in a longitudinal direction of the second substrate, the second LED is disposed in the front portion of the second substrate in a case where the second substrate has the substrate fitting slit at a middle portion or a relatively rear portion thereof in the longitudinal direction of the second substrate perpendicular to the first substrate, or the second LEDs are disposed respectively in the front portion and the rear portion of the second substrate with respect to the substrate fitting slit.

Connection terminals for connection between the first substrate and each of the second substrate or for connection between each of the second substrates via the first substrate are provided around the substrate engaging slits of the first substrate and around the substrate fitting slits of the second substrates in a state in which the first substrate is coupled with the second substrates.

An electrical connection between the second LED and a control circuit for controlling operation of the second LED may be achieved via an electrical connection between the connection terminal of the first substrate and the connection terminal of the second substrate.

Advantageous Effects

The embodiments of the present invention improve the hemispherical intensity distribution of a lighting device using LEDs (for example, an LED lamp), thereby improving the lighting efficiency of the lighting device using LEDs.

In addition, the embodiments of the present invention provide a technique for improving heat dissipation in an LED lighting device using the convection phenomenon. Therefore, the LED lighting device is not required to be equipped with an additional heat dissipating structure such as a heat sink, thereby resulting in reduction in overall size and weight and a decrease in manufacturing cost of the LED lighting device. Therefore, with the use of the LED lighting substrate structure, LED lighting devices at good prices can be provided.

BEST MODE

Figure 1:
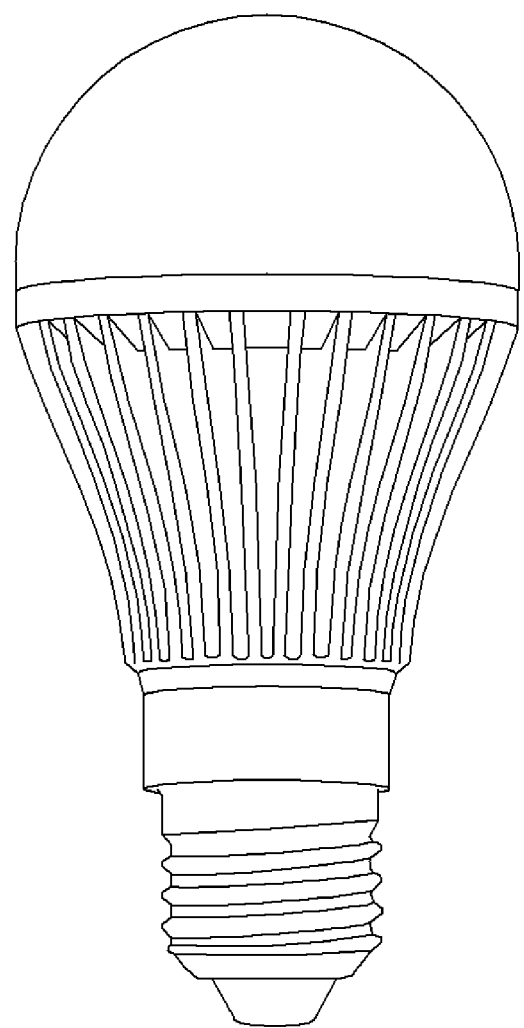
FIG. 1 is a perspective view illustrating an exterior form of a conventional LED bulb.
Figure 2:
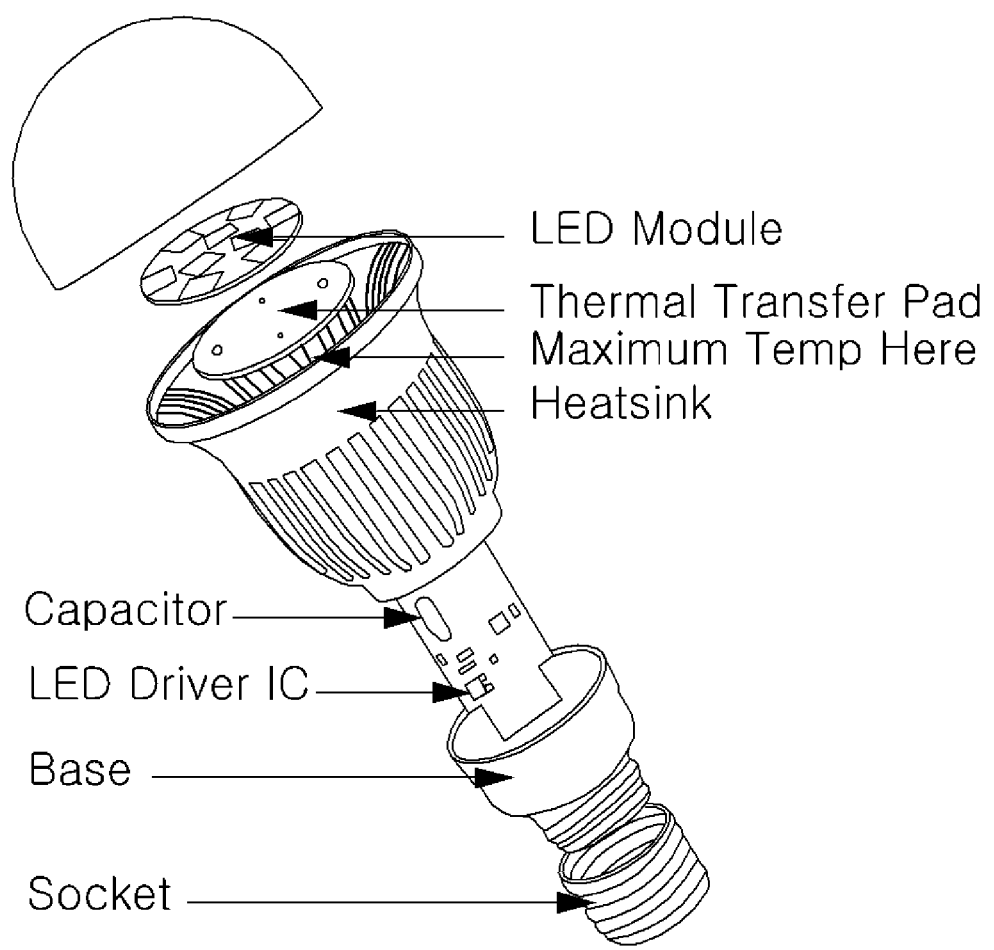
FIG. 2 is an exploded perspective view illustrating parts of a conventional LED bulb.

The following description relates to embodiments of the present invention and the embodiments will be described with reference to the accompanying drawings. The embodiments will be described in so detail that those who ordinarily skilled in the art can implement the present invention. It should be noted that embodiments may not be exclusively implemented although the embodiments differ from each other. For example, the particular shapes, structures, and characteristics described herein in connection with one embodiment may be embodied in other forms without departing from the spirit and scope of the invention. It is also to be understood that the position or arrangement of the individual components within each described embodiment may be changed without departing from the spirit and scope of the present invention.

The following detailed description is therefore not to be taken in a limiting sense, and the scope of the present invention is to be limited only by the appended claims and by the full scopes of equivalents thereto, if properly explained. In the drawings, like reference numerals refer to like functions throughout the drawings.

While the present invention has been described with terms that are presently considered to be the most practical and preferred, in consideration of the functions in the present invention, the terms may be altered according to the intent of a user or operator, general practices, judicial precedents, and emergence of new technology. Also, in some cases, there may be terms selected arbitrarily by the to applicant. In such cases, the meaning thereof will be described in detail in the description of the invention. Therefore, the terms used in the present invention should not be defined only based on the names of the terms but should be defined based on the meanings of the terms and the entire contents of the present invention.

It will be further understood that the terms "comprise", "include", "have", etc. when used in this specification, specify the presence of stated features, integers, steps, operations, elements, components, and/or combinations of them but do not preclude the presence or addition of one or more other features, integers, steps, operations, elements, components, and/or combinations thereof, unless stated otherwise. Also, the terms part", unit", "module", "apparatus" and the like mean a unit for processing at least one function or operation and may be implemented by a combination of hardware and/or software.

Referring to FIGS. 4 to 11, a substrate structure for LED lighting (hereinafter, referred to as an LED lighting substrate structure), according to an embodiment of the present invention, will be described.

Figure 4:
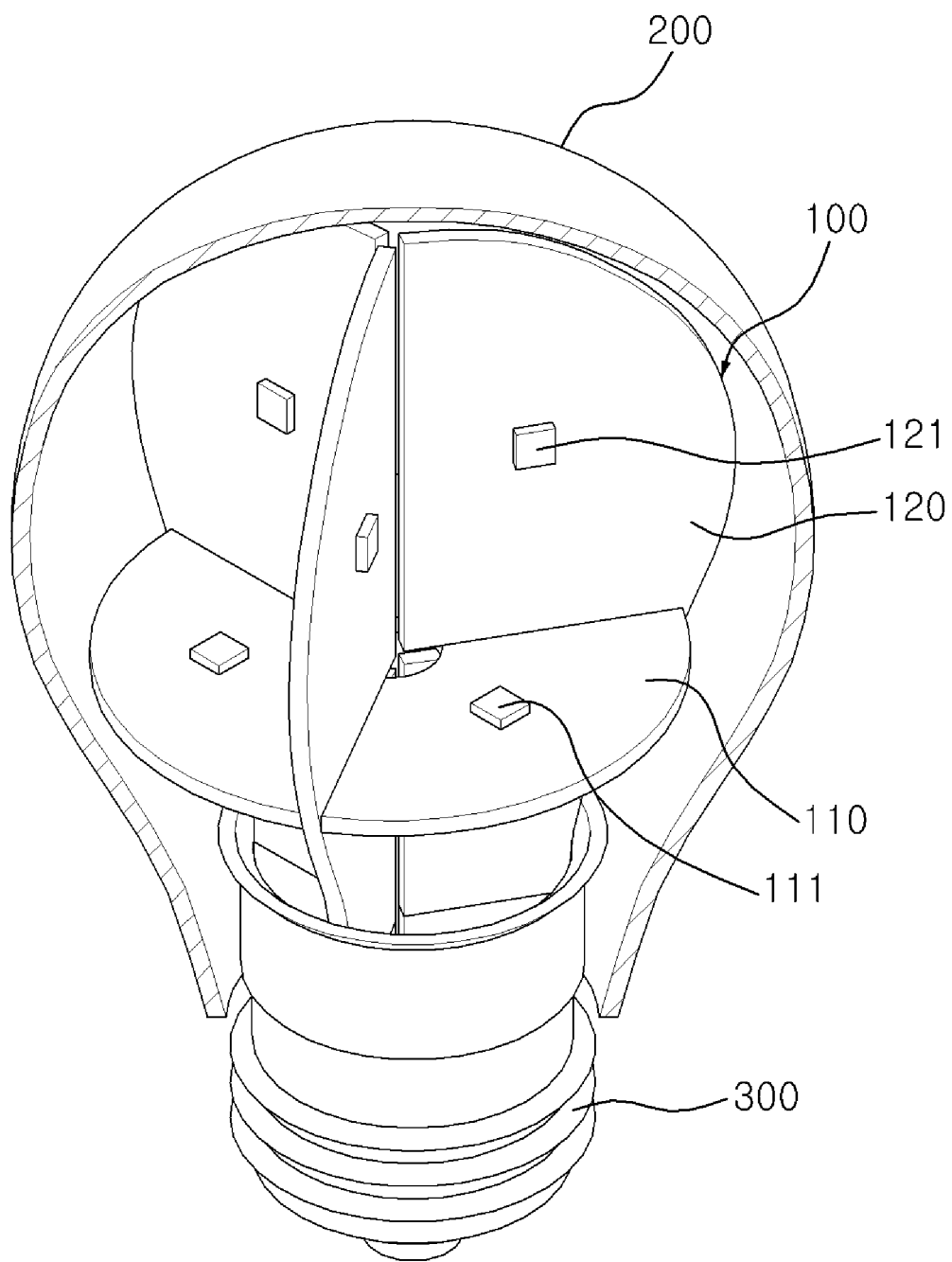
FIG. 4 is a perspective view illustrating an LED bulb in which an LED lighting substrate structure according to an embodiment of the present invention is provided.
Figure 5:
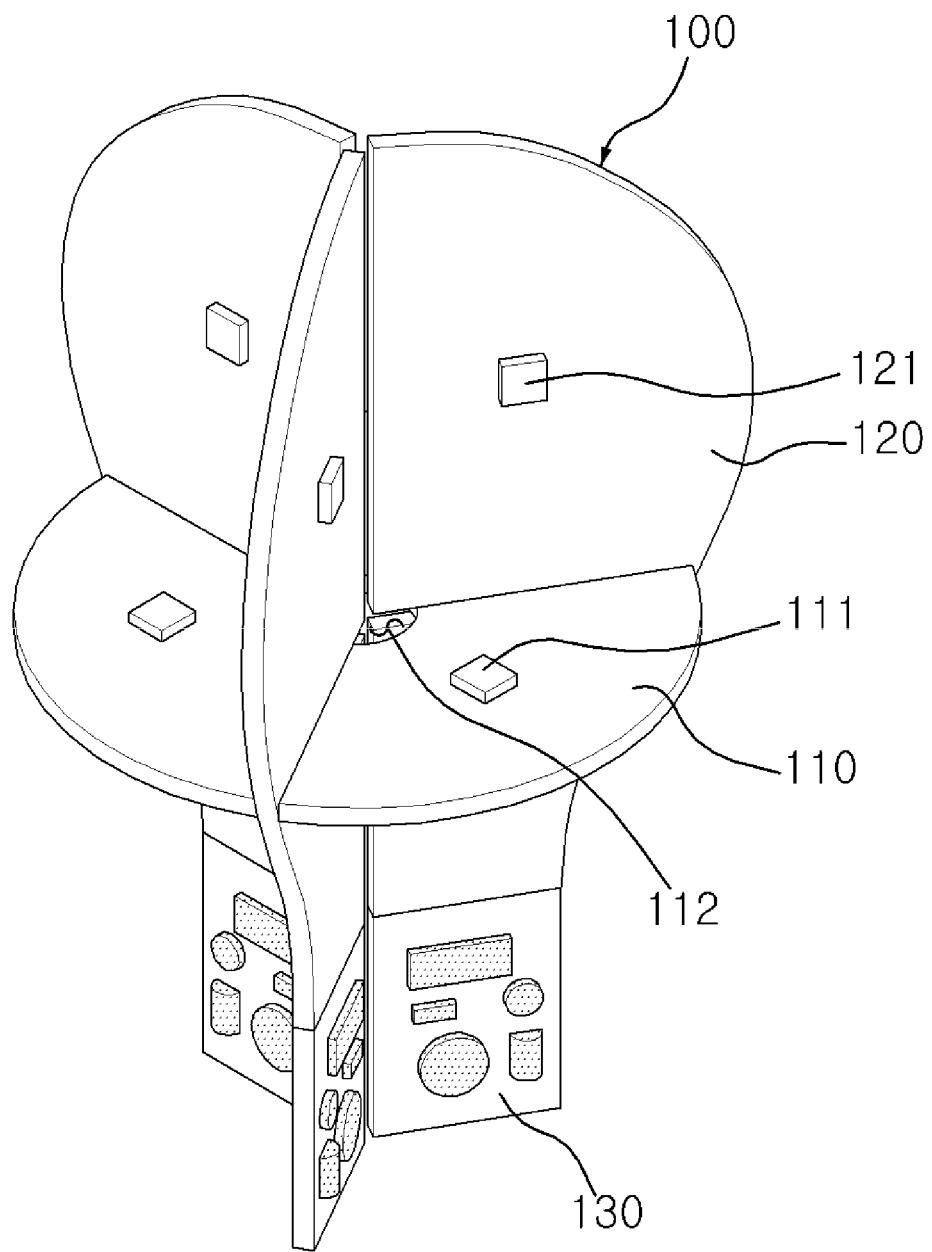
FIG. 5 is a perspective view illustrating an overall exterior form of the LED lighting substrate structure of FIG. 4.
Figure 6:
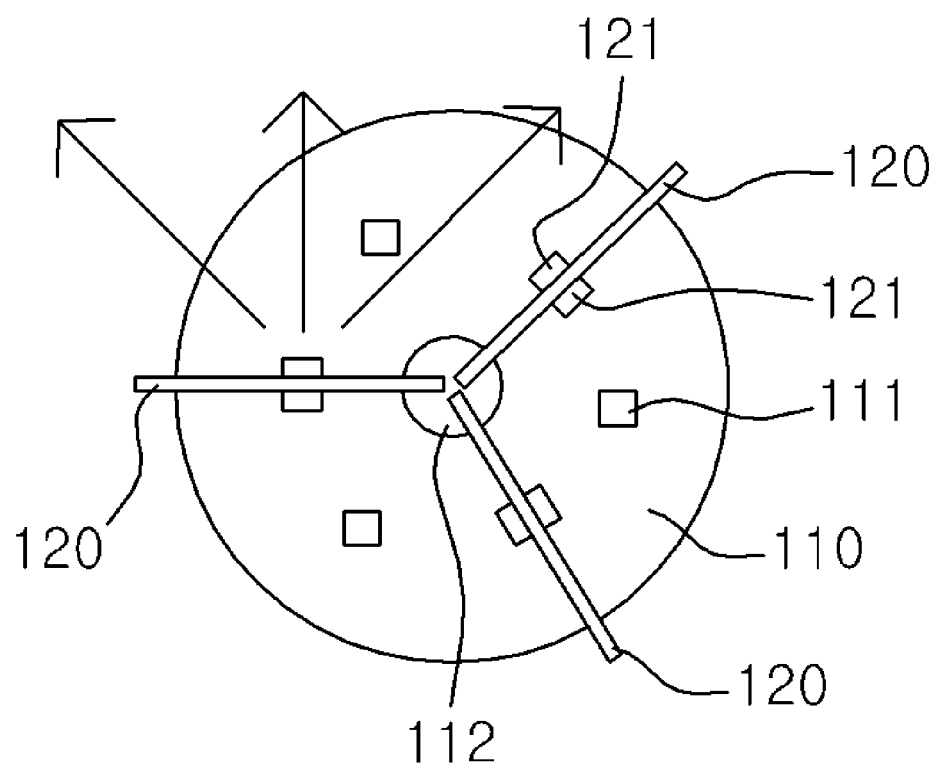
FIG. 6 is a top plan view of the LED lighting substrate structure of FIG. 5.

FIG. 4 is a perspective view illustrating an example in which an LED lighting substrate structure according to an embodiment of the present invention is applied to an LED bulb, FIG. 5 is a perspective view illustrating the overall external form of the LED lighting substrate structure of FIG. 4, and FIG. 6 is a top plan view of the LED lighting substrate structure.

As illustrated in the figures, an LED lighting substrate structure 100 according to an embodiment of the present invention includes a first substrate 110 and a second substrate 120. The LED lighting substrate structure 100 according to the embodiment of the present invention further includes a luminance sensor 150.

The first substrate 110 is a component for mounting a first LED 111 thereon. Herein after, the first substrate 110 will be understood in conjunction with the following description of a second substrate 120 and will be further mentioned in the middle of describing the second substrate 120. Although the first LED 110 is provided on one surface of the first substrate 110 in the present embodiment, the present invention is not limited thereto. That is, there may be multiple first LEDs 110 provided on both of the surfaces of the first substrate 110.

The second substrate 120 is perpendicularly coupled to the first substrate 110. The second to substrate 120 is composed of three substrates that are coupled to the first substrate 110 while being arranged at an angular interval of about 120° with respect to each other. In other words, each of the three second substrates 120 is disposed to be perpendicular to the first substrate 110 and the three second substrates 120 are arranged to have an angle of about 120° with respect to each other in a cross-sectional view which is cut in a direction parallel to the first substrate 110. In the present embodiment, although the angular interval between each of the three second substrates 120 is set to an angle within a range of 115° to 125°, the present invention is not limited thereto.

Second LEDs 121 are mounted on the second substrates 120. That is, the second LEDs 121 may be respectively mounted on the three second substrates 120.

Each control circuit 130 for controlling operation of either of or both of the second LEDs 121 and the first LEDs 111 is mounted in an end portion of a corresponding one of the second substrates 120 in a direction perpendicular to the first substrate 110. In the present embodiment, the control circuit 130 is mounted on the corresponding second substrate 120. However, the present invention is not limited thereto. That is, each control circuit 130 may be mounted on an additional substrate separated from the corresponding second substrate 120.

In this embodiment, the control circuits 130 are provided on the respective three second substrates 120. However, the present invention is not limited to this. The control circuits 130 may be provided on any one or any two second substrates 120 of the three second substrates 120. In this case, the control circuits 130 that are mounted on the respective three second substrates 120 or mounted on only some of the three second substrates 120 may be electrically connected to each other via the first circuit board 110. This will be further described with reference to FIGS. 7 to 9.

A control circuit (refer to FIG. 8) for controlling the operation of either of or both of the first LED 111 and the second LED 121 may be mounted on the first substrate 110. In the present embodiment, the control circuit is mounted on a second surface of the first substrate, in which the second surface is opposite to a first surface on which the first LED is installed. However, the present invention is not limited to this embodiment. That is, the control circuit and the first LED may be installed on the same surface of the first substrate. More specifically, among the surfaces of the first substrate 110, the first LED 111 is installed on one surface that faces the second LED 121 mounted on to the second substrate 120, and the control circuit is mounted on the opposite surface on which the first LED 111 is not mounted.

The embodiment described above relates to an application example in which the LED lighting substrate structure 100 according to an embodiment of the present invention is applied to an LED lamp (LED bulb), but the application example of the present invention is not limited thereto.

For each of the second substrates 120, second LEDs 121 are mounted on the respective surfaces of the corresponding second substrate 120. In this case, the second LEDs 121 mounted on the second substrates 120 are disposed on a line spaced a same distance from the first substrate 110. The first substrate 110 is partitioned into three regions by the three second substrates 120. Each region of the first substrate 110 may be provided with one or more first LEDs 111.

The first substrate 110 is provided with a vent hole 112 for convection of heat between an inside region in which the first LEDs 111 and the second LEDs 121 are installed and an outside region in which the first LEDs 111 and the second LEDs 121 are not installed. In a lighting device to which the LED lighting substrate structure 100 according to an embodiment of the present invention is applied, the convection hole 112 functions to dissipate the heat generated from the inside regions in which the first and second LEDs 111 and 121 are installed. In this embodiment, the vent hole 112 is a single formed at the center of the first substrate 110, but the present invention is not limited thereto.

More specifically, the present embodiment relates to an example in which the LED lighting substrate structure 100 is applied to an LED lamp (LED bulb). That is, a predetermined area including the first substrate 110 and the second substrates 120 on which the first LEDs 111 and the second LEDs 121 are installed is surrounded by a bulb cover 200. In addition, in the bulb cover 200, heat convection occurs between the inside region in which the first LEDs 111 and the second LEDs 121 are disposed and the outside region in which the first LEDs 111 and the second LEDs 121 are not disposed through the vent hole. Among the regions inside the bulb cover 200, the outside region in which the first LEDs 111 and the second LEDs 121 are not disposed is configured to communicate with the inside of a bulb socket 300. Therefore, heat convection also occurs between these two regions. Therefore, the heat dissipation in the region where the first LEDs 111 and the second LEDs 121 are disposed within the bulb cover 200 is remarkably improved.

Among the regions disposed inside the bulb cover 200, the region in which the first LEDs 111 and the second LEDs 121 are disposed and the remaining region in which the first LEDs 111 and the second LEDs 121 are not disposed may be understood as regions (an upper side region and a lower side region) divided by the first substrate 110.

The luminance sensor (refer to FIG. 8) is installed on a second surface of the first substrate 110, in which the second surface is opposite to the first surface on which the first LEDs 111 are installed, or installed at a position spaced from the second surface. The illumination sensor functions to sense the luminance around the lighting device provided with the first LEDs 111 and the second LEDs 121. When describing the present embodiment in greater detail, the luminance sensor senses the ambient luminance of the LED lamp including the first LEDs 111 and the second LEDs 121.

Either one or both of the control circuit 140 mounted on the first substrate 110 and the control circuit 130 mounted on the second substrate 120 control the operations of the first LEDs 111 or the second LEDs 121 according to the luminance value sensed by the luminance sensor.

Figure 7:
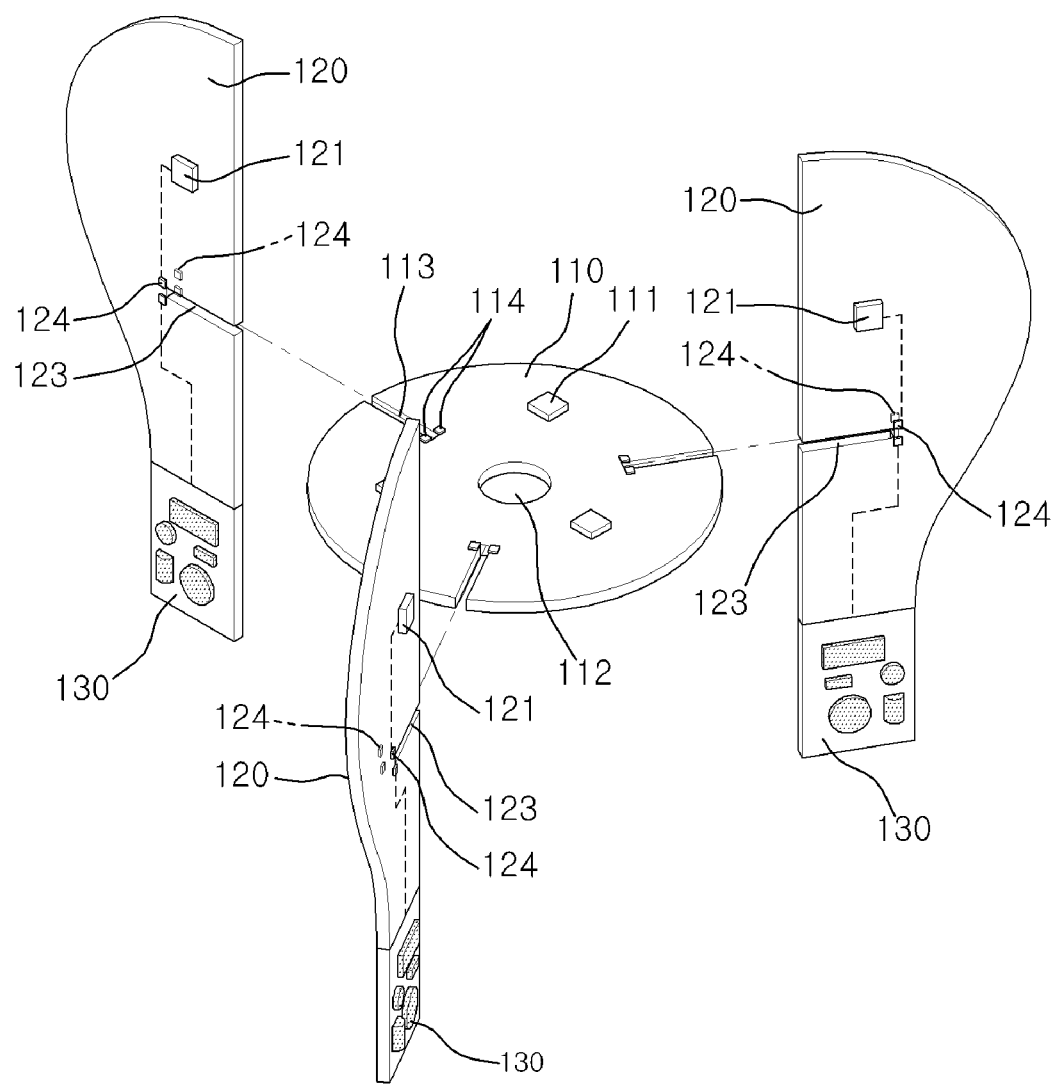
FIG. 7 is a perspective view illustrating an example of coupling between substrates in the LED lighting substrate structure of FIG. 5.

FIG. 7 is a perspective view illustrating an example in which the substrates of the LED lighting substrate structure 100 illustrated in FIG. 5 are coupled to each other. Referring to FIG. 7, the coupling structure in which the first substrate 110 and the second substrates 120 in the LED lighting substrate structure 100 according to an embodiment of the present invention are coupled to each other will be described.

As shown in FIG. 7, the first substrate 110 is provided with three substrate engaging slits 113 into which the second substrates 120 are to be inserted and which are formed at an angular interval of about 120°. Each of the substrate engaging slits 113 extends in a radial direction and is open at the periphery of the first substrate 110.

Each of the second substrates 120 is provided with a substrate fitting slit 123 into which the first substrate 110 is inserted in a state in which the second substrates 120 are inserted into the respective substrate engaging slits 113. That is, the three second substrates 120 are inserted into the substrate engaging slits 113 of the first substrate 110 and the first substrate 110 is inserted into the substrate fitting slits 123 of the second substrates 120. In this way, the first substrate 110 and the second substrates 120 are coupled to each other.

Connection terminals 114 and 124 for connection between the first substrate 110 and each of the second substrates 120 and/or for connection between each of the second substrates 120 via the first substrate 110 are provided around the substrate engaging slits 113 of the first substrate 110 and/or the substrate fitting slits 123 of the second substrate 120. The connection terminals 114 and 124 are terminals attached to the first substrate 110 or the second substrates 120. Alternatively, the connection terminals 114 and 124 are contacts provided in the first substrate 110 or the second substrates 120. The connection between the connection terminal 114 and the connection terminal 24 may be accomplished by a contact between the connection terminals 114 and 124 or by a soldered structure.

In the present embodiment, when the first substrate 110 is inserted into the substrate fitting slits 123 of the second substrates 120 and the second substrates 120 are inserted into the substrate engaging slits 113 of the first substrate 110, the connection terminals 114 of the first substrate 110 and the connection terminals 124 of the second substrate 120 are brought into contact with each other so that the second LEDs 121 mounted on the second substrates 120 and the control circuits 130 mounted on the second substrates 120 are electrically connected. In this embodiment, the electrical connection between the connection terminals 114 of the first substrate 110 and the connection terminals 124 of the second substrates 120 is implemented in a contact manner. However, as described above, the electrical connection between the connection terminals 114 of the first substrate 110 and the connection terminals 124 of the second substrates 120 may be implemented by a soldered structure.

Figure 8:
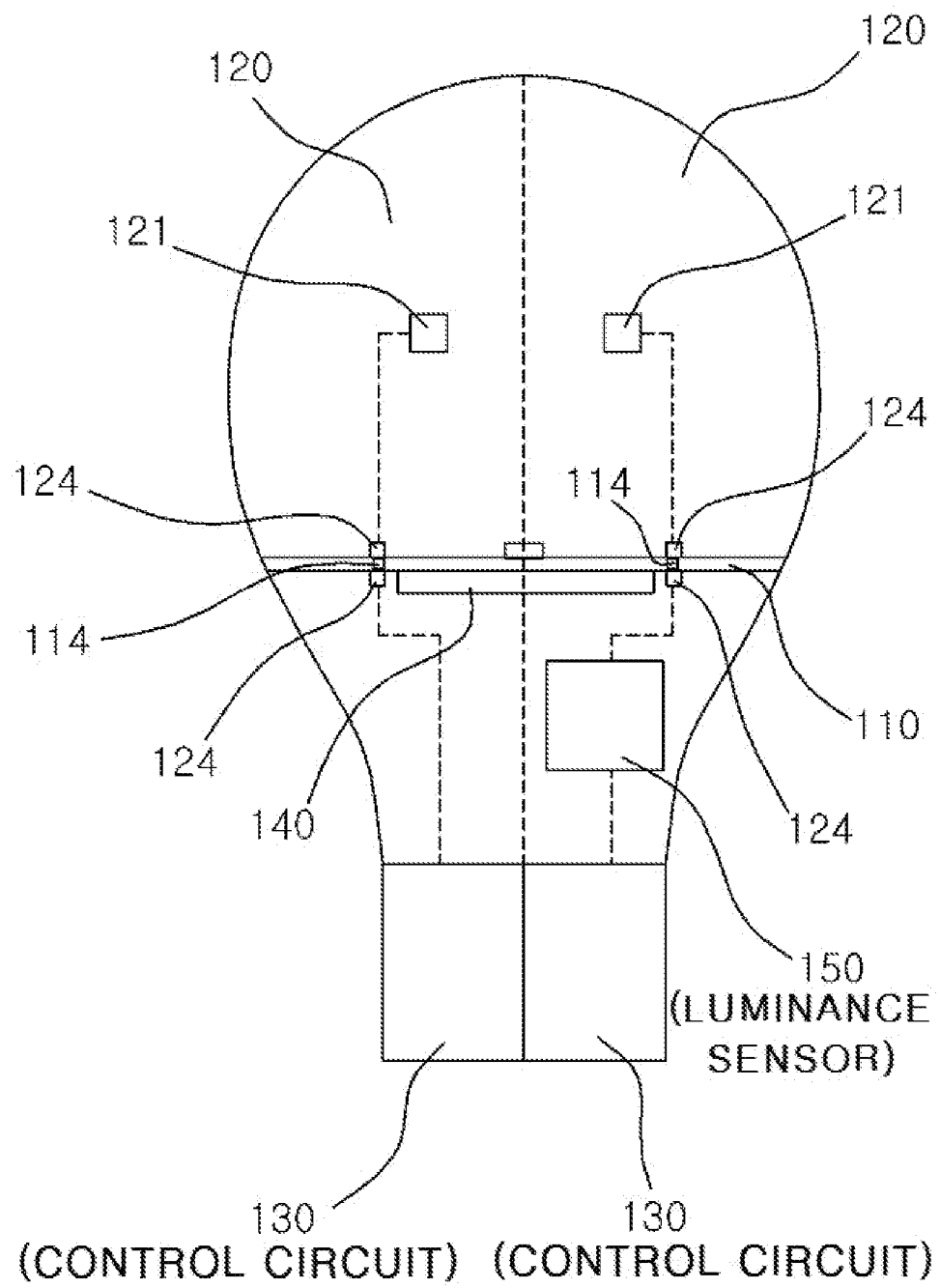
FIG. 8 is a view illustrating an example of an electrical connection structure of the substrates of FIG. 7.

FIG. 8 illustrates a state in which the connection terminals 114 of the first substrate 110 and the connection terminals 124 of the second substrates 120 are electrically connected through the coupling between the first substrate 110 and the second substrates 120. The luminance sensor 150 is disposed at an output terminal of the control circuit 130 and connected to the connection terminal 124 of the second substrate 120. FIG. 8 illustrates this example.

In FIGS. 7 and 8, dotted lines represent wirings for connection between the second LEDs 121 mounted on the second substrates 120 and the connection terminals 124 and for connection between the control circuits 130 mounted on the second substrates 120 and the connection terminals of the second substrates 120. The wirings are, for example, circuit patterns formed on the second substrates 120 but the present invention is not limited thereto.

Figure 9:
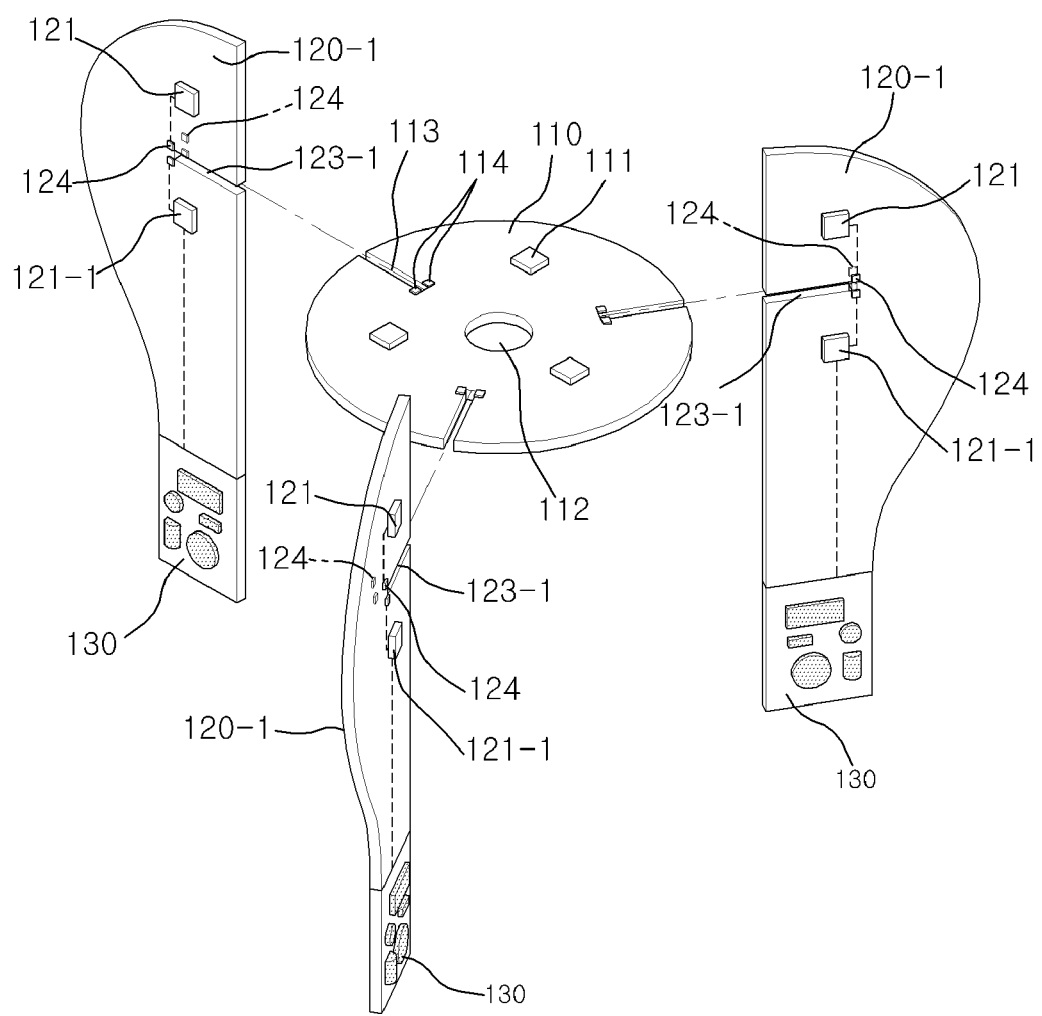
FIG. 9 is a perspective view illustrating another example of coupling between substrates in the LED lighting substrate structure of FIG. 5.

FIG. 9 is a perspective view illustrating another example in which the substrates of the LED lighting substrate structure 100 illustrated in FIG. 5 are coupled to each other.

In describing this example, in a longitudinal direction of each of second substrates 120-1 arranged perpendicular to a first substrate 110, a first portion of the second substrate 120-1 that is relatively far from a driving circuit (i.e., control circuit 130) for driving a lighting device including first LEDs 111 and second LEDs 121-1 is defined as a front portion.

As shown in FIG. 9, each of the second substrates 120-1 is provided with a substrate fitting recess 123-1 in a relatively front portion thereof in a longitudinal direction of the second substrate 120-1 that is perpendicular to the first substrate 110, and second LEDs 121 and 121-1 are installed at the front side and the rear side of the substrate fitting slit 123-1, respectively.

The connection of the control circuit 130 with the second LEDs 121 and 121-1 respectively provided on the front side and the rear side of the substrate fitting slit 123-1 is made via a connection terminal 114 of the first substrate 110 and a connection terminal 124 of the second substrate 120 as described with reference to FIG. 7. However, in comparison with FIG. 7, a difference point of the embodiment of FIG. 9 is that a rear side second LED 121-1 is connected in series with an output terminal of the control circuit 130 connected to the connection terminal 124 of the second substrate 120-1.

More specifically, FIG. 7 illustrates an embodiment in which the substrate fitting slit 123 is provided at the middle portion or in the rear portion of the second substrate 120 of the second substrate and the second LEDs 121 are disposed only in the front portion of the second substrate 120, when the second substrate 120 is divided into the front portion and the rear portion disposed on respective sides of the middle portion in the longitudinal direction of the second substrate 120. This case also can be described in a manner that the second LEDs 121 are disposed at the front side of the substrate fitting slit 123.

According to the above-described configuration, in the LED lighting substrate structure, the first LED and the second LED are disposed on the second substrate and the first substrate, respectively. With this configuration, the vertical luminous intensity distribution is improved by the first LED installed on the first substrate. Therefore, the light distribution characteristic of a lighting device to which the LED lighting substrate structure of the present invention is applied is improved.

In addition, since the angular interval between the three second substrates is maintained at about 120°, the amount of reflected light of the total luminous flux emitted from the LED can be reduced. Therefore, the light efficiency of a lighting device to which the LED lighting substrate structure is applied can be improved.

Figure 10:
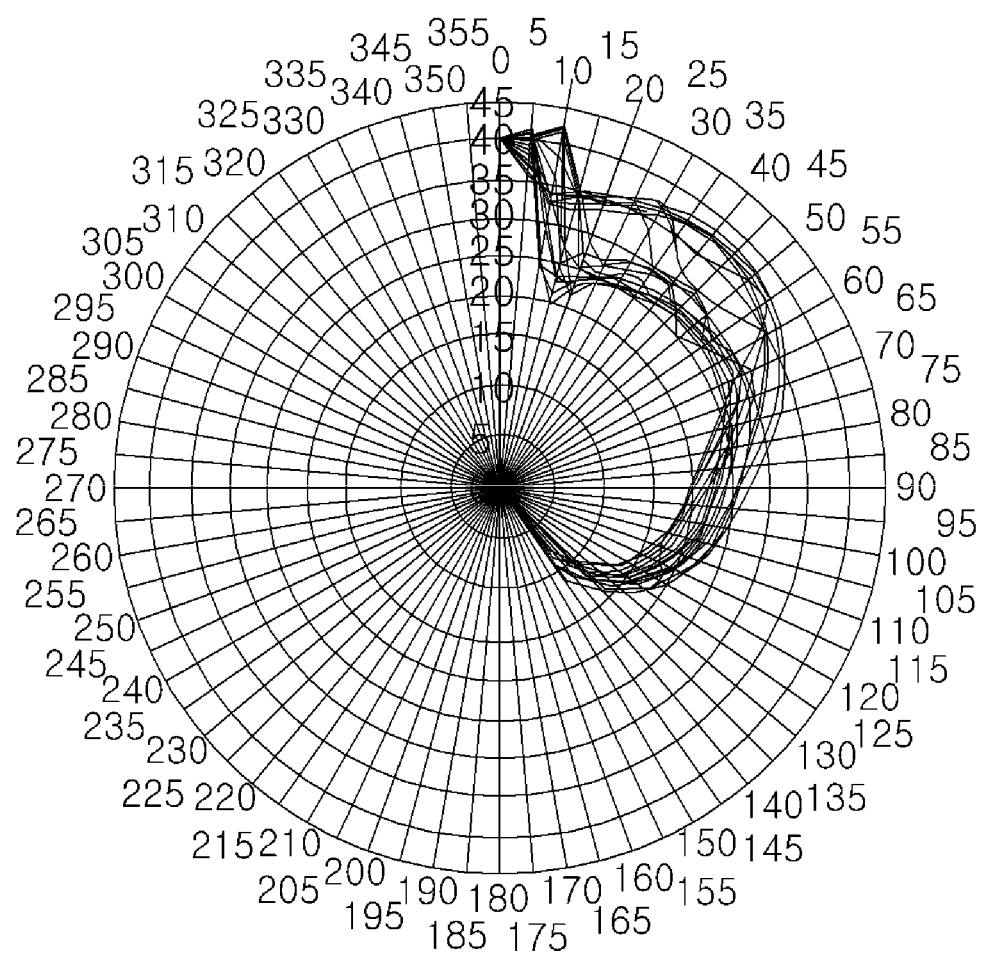
FIGS. 10 and 11 are views illustrating the hemispherical intensity distribution of an LED bulb in which the LED lighting substrate structure according to an embodiment of the present invention is provided.
Figure 11:
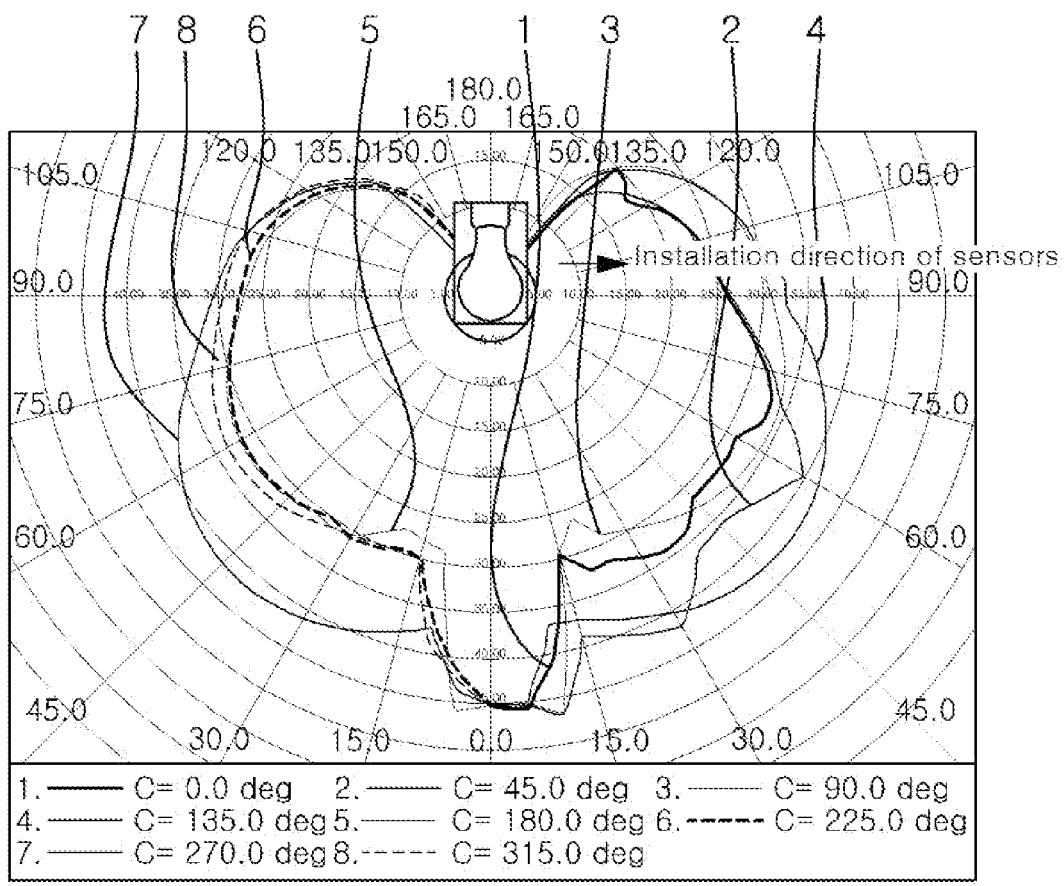

FIGS. 10 and 11 are diagrams illustrating the hemispherical intensity distribution of an LED bulb to which an LED lighting substrate structure according to an embodiment of the present invention applied.

Among the figures, FIG. 10 is a graph of the hemispherical intensity distribution of a bulb-type LED lighting device in which the LED lighting substrate structure according to an embodiment of the present invention is provided, in which the light intensity is measured while moving a luminance sensor in a circumferential direction around the LED lighting device.

FIG. 11 is a graph showing the graph of FIG. 10 in an easy-to-see manner. For reference, since it is difficult to visually discern the hemispherical intensity distribution characteristics according to the installation angles of sensors when the graphs of the rear intensity distributions are illustrated only on one side, it is to be noted that a part of the graph is shown symmetrically on the opposite side.

Figure 3:
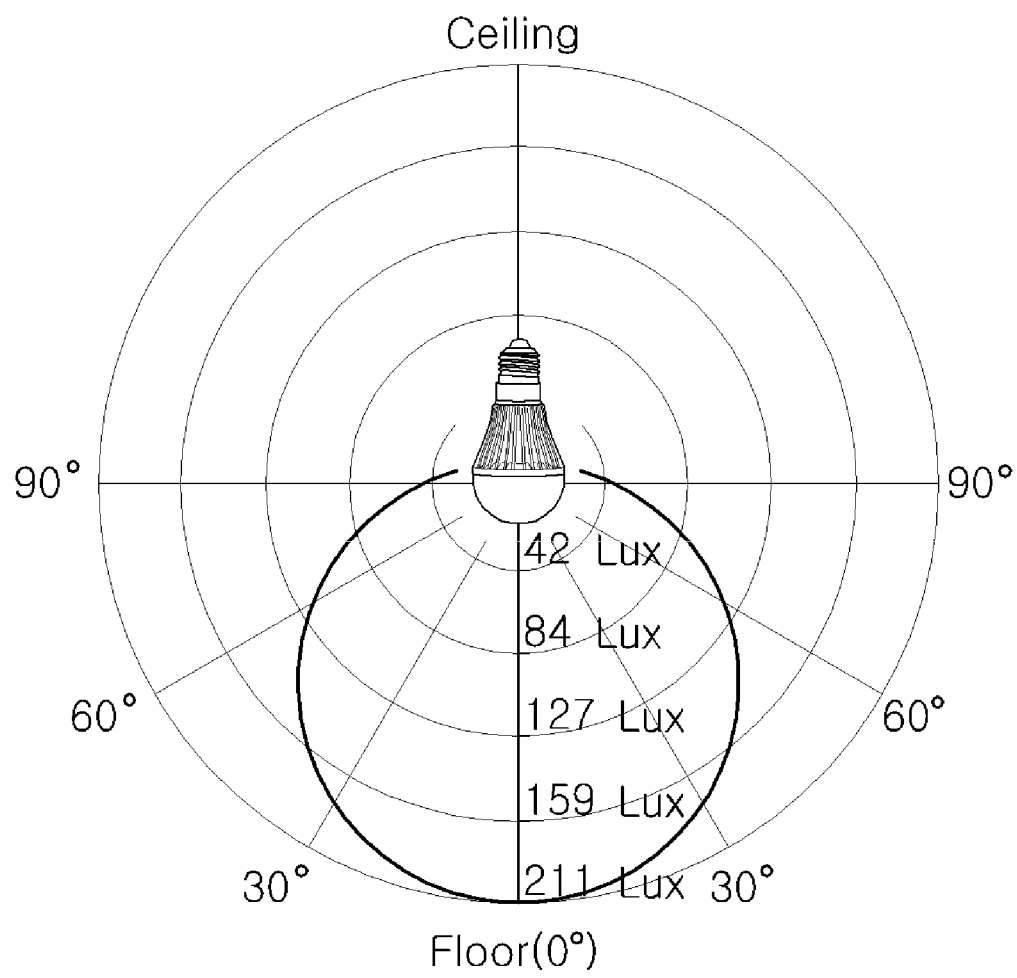
FIG. 3 is a diagram illustrating the luminous intensity distribution of a conventional LED bulb.

Referring to FIG. 11, the advantage of the present invention is further described. That is, it is possible to confirm that an LED bulb to which the present invention is applied exhibits an improved hemispherical intensity distribution compared to a conventional LED illustrated shown in FIG. 3.

While the present invention has been described with respect to specific items such as specific constituent elements, with reference to some exemplar)/embodiments and the drawings, they are presented only to help with understanding of the outline of the present invention. Thus, it will be apparent to those skilled in the art that the present invention is not limited to the embodiments described above and that various changes and modifications may be made without departing from the spirit and scope of the invention as defined in the following claims.

Therefore, the spirit of the present invention should not be construed as being limited to the embodiments described above, and not only the following claims but also all of the equivalents to the claims and modifications of the equivalents fall within the scope of the present invention.

INDUSTRIAL APPLICABILITY

The present invention can be widely used in a substrate structure for LED lighting.

The invention claimed is:

1. A substrate structure for LED lighting, the structure comprising:
   a first substrate configured to mount a first LED thereon; and
   three second substrates coupled to the first substrate such that the three second substrates are perpendicular to the first substrate and are arranged at an angular interval of about 120° with respect to each other in a cross sectional view taken in a direction parallel to the first substrate,
   wherein the first substrate is provided with three substrate engaging slits arranged at an each of the second substrates being configured to mount a second LED thereon, angular interval of about 120° at an outer periphery of the first substrate so that the second substrates are installed to pass through the respective substrate engaging slits, and each of the second substrates is provided with a substrate fitting slit into which the first substrate is inserted when the second substrates are coupled to the first substrate in a manner of inserted into the substrate engaging slits of the first substrate, respectively.

2. The substrate structure for LED lighting, according to claim 1, wherein the second substrates are arranged at an angular interval which is within a range of from 115° to 125°.

3. The substrate structure for LED lighting, according to claim 1, further comprising a control circuit for controlling operation of either one of or both of the first LED and the second LED, the control circuit being disposed in a region of one second substrate or a region of each of two or more second substrates of all the second substrates, the region being disposed at one side of the first substrate in a direction perpendicular to the first substrate.

4. The substrate structure for LED lighting, according to claim 3, wherein the first substrate is provided with a control circuit for controlling operation of either one of or both of the first LED and the second LED.

5. The substrate structure for LED lighting, according to claim 1, wherein the first substrate is provided with a control circuit for controlling operation of either one of or both of the first LED and the second LED.

6. The substrate structure for LED lighting, according to claim 1, wherein the second LEDs are respectively installed on both surfaces of each of the second substrates, and the first LED is installed on a first surface of the first substrate, the first surface facing the second LED.

7. The substrate structure for LED lighting, according to claim 6, wherein the second LEDs mounted on the second substrates may be positioned on a line having an equal distance from the first substrate, and one or more first LEDs of the first LEDs may be installed in each region of all regions of the first substrate demarcated by the second substrates.

8. The substrate structure for LED lighting, according to claim 1, wherein the first substrate is provided with a vent hole for convection of heat between an inside region where the first LED and the second LED are installed and an outside region where the first LED and the second LED are not installed.

9. The substrate structure for LED lighting, according to claim 8, wherein the vent hole is a single hole formed at a center of the first substrate.

10. The substrate structure for LED lighting, according to claim 1, further comprising a luminance sensor provided on a second surface of the first substrate, which is opposite to a first surface on which the first LED is installed, or provided at a position spaced from the second surface, and functioning to sense luminance around a lighting device including the first LED and the second LED.

11. The substrate structure for LED lighting, according to claim 1, wherein when a first portion of each of the second substrates arranged to be perpendicular to the first substrate is a portion relatively far from a driving circuit of a lighting device including the first LED and the second LED substrate in a longitudinal direction perpendicular to the first substrate, and the first portion is defined as a front portion, the second LED is disposed in the front portion of the second substrate in a case where the second substrate has the substrate fitting slit at a middle portion or a relatively rear portion thereof in the longitudinal direction of the second substrate perpendicular to the first substrate, or the second LEDs may be disposed respectively in the front portion and the rear portion of the second substrate which is provided at both sides of the substrate fitting slit in the longitudinal direction of the second substrate.

12. The substrate structure for LED lighting, according to claim 1, further comprising connection terminals for connection between the first substrate and each of the second substrate or for connection between each of the second substrates via the first substrate, the connection terminals being provided around the substrate engaging slits of the first substrate and around the substrate fitting slits of the second substrates when the first substrate is coupled with the second substrates.

13. The substrate structure for LED lighting, according to claim 12, wherein an electrical connection between the second LED and a control circuit for controlling operation of the second LED may be achieved through an electrical connection between the connection terminal of the first substrate and the connection terminal of the second substrate.

14. A substrate structure for LED lighting, the structure comprising:
- a first substrate configured to mount a first LED thereon; and
- three second substrates coupled to the first substrate such that the three second substrates are perpendicular to the first substrate and are arranged at an angular interval of about 120° with respect to each other in a cross sectional view taken in a direction parallel to the first substrate, each of the second substrates being configured to mount a second LED thereon,
- wherein the first substrate is provided with a vent hole for convection of heat between an inside region where the first LED and the second LED are installed and an outside region where the first LED and the second LED are not installed, and the vent hole is a single hole formed at a center of the first substrate.

15. The substrate structure for LED lighting, according to claim 14, wherein the second substrates are arranged at an angular interval which is within a range of from 115° to 125°.

16. The substrate structure for LED lighting, according to claim 14, further comprising a control circuit for controlling operation of either one of or both of the first LED and the second LED, the control circuit being disposed in a region of one second substrate or a region of each of two or more second substrates of all the second substrates, the region being disposed at one side of the first substrate in a direction perpendicular to the first substrate.

17. A substrate structure for LED lighting, the structure comprising:
- a first substrate configured to mount a first LED thereon; and
- three second substrates coupled to the first substrate such that the three second substrates are perpendicular to the first substrate and are arranged at an angular interval of about 120° with respect to each other in a cross sectional view taken in a direction parallel to the first substrate, each of the second substrates being configured to mount a second LED thereon, and
- a luminance sensor provided on a second surface of the first substrate, which is opposite to a first surface on which the first LED is installed, or provided at a position spaced from the second surface, and functioning to sense luminance around a lighting device including the first LED and the second LED.

18. The substrate structure for LED lighting, according to claim 17, wherein the second substrates are arranged at an angular interval which is within a range of from 115° to 125°.

19. The substrate structure for LED lighting, according to claim 17, further comprising a control circuit for controlling operation of either one of or both of the first LED and the second LED, the control circuit being disposed in a region of one second substrate or a region of each of two or more second substrates of all the second substrates, the region being disposed at one side of the first substrate in a direction perpendicular to the first substrate.

* * * * *